United States Patent [19]

Wakatsuki et al.

[11] 4,314,393

[45] Feb. 9, 1982

[54] METHOD OF MANUFACTURING ACOUSTIC SURFACE WAVE DEVICE

[75] Inventors: Noboru Wakatsuki; Ono Masaaki, both of Kawasaki, Japan

[73] Assignee: Fujitsu Limited, Kawasaki, Japan

[21] Appl. No.: 133,964

[22] Filed: Mar. 26, 1980

[30] Foreign Application Priority Data

Apr. 2, 1979 [JP] Japan .............................. 54/41963[U]

[51] Int. Cl.³ ............................................. H01L 41/22
[52] U.S. Cl. ..................................... 29/25.35; 29/593; 324/56; 324/80
[58] Field of Search ............................. 29/25.35, 593; 310/313 B, 313 R; 324/56, 80

[56] References Cited

U.S. PATENT DOCUMENTS 4,112,360 9/1978 Bergmann .............................. 324/80

Primary Examiner—Carl E. Hall
Attorney, Agent, or Firm—Staas & Halsey

[57] ABSTRACT

A method of manufacturing an acoustic surface wave device comprising: forming two pairs of transducers, a multistrip coupler and lead patterns for electrically shorting at least one pair of the transducers on a piezoelectric material; mounting the piezoelectric material on a package base having pins; bonding the electrodes of the opened transducers to the pins by wires, and; testing the device by applying and obtaining signals of the opened transducers through the pins. In this manufacturing method, testing is carried out without using probing technology.

17 Claims, 30 Drawing Figures

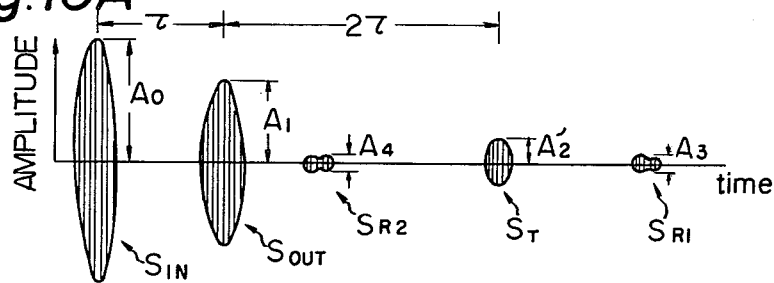
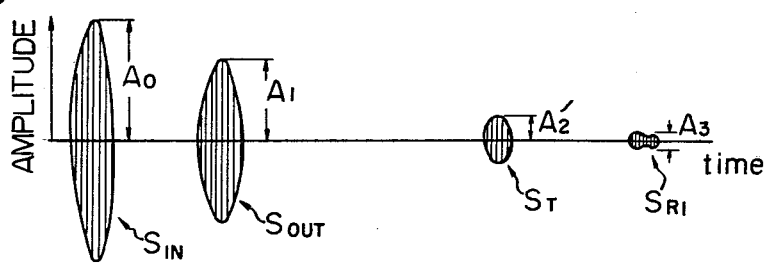
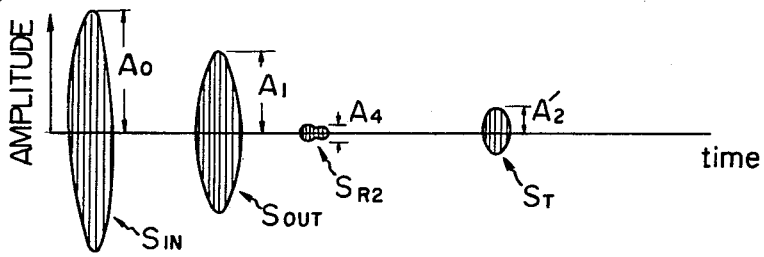
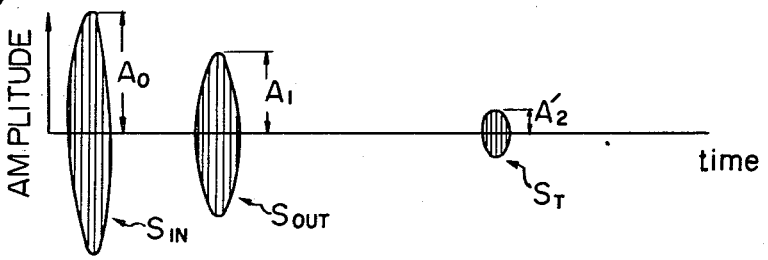

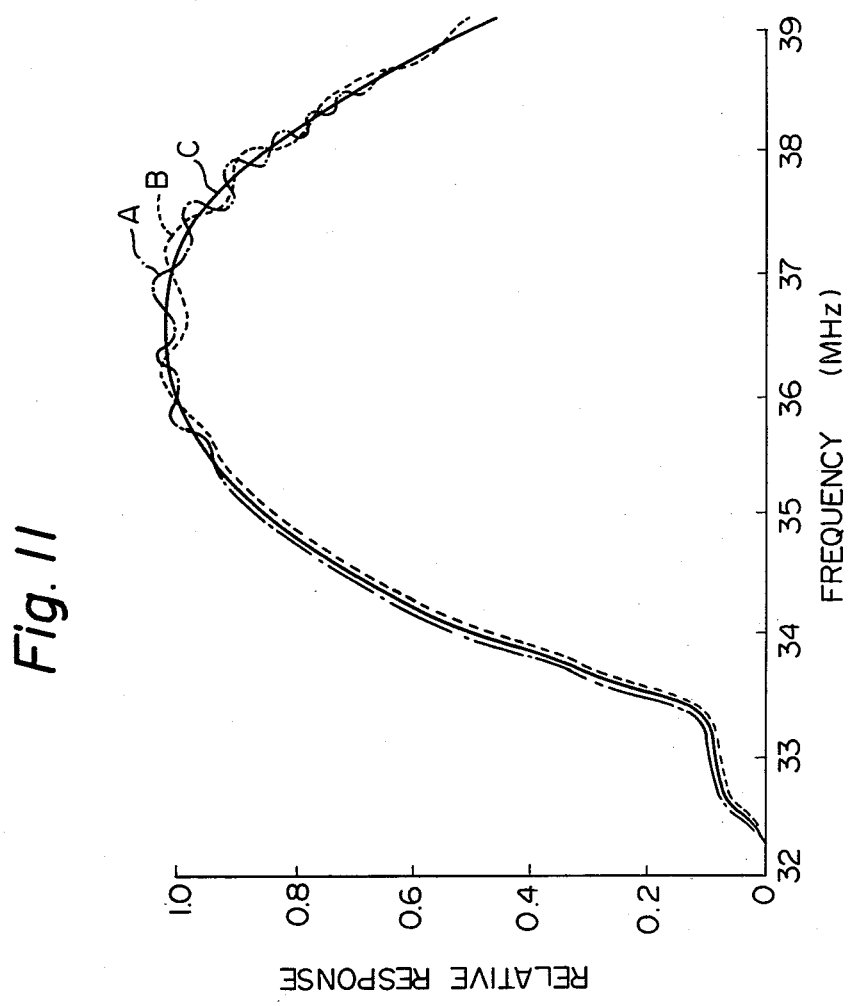

METHOD OF MANUFACTURING ACOUSTIC SURFACE WAVE DEVICE

BACKGROUND OF THE INVENTION

The present invention relates to a method of manufacturing an acoustic surface wave device which serves as a band pass filter, a delay line or the like.

In general, conversion from acoustic surface waves propagating across a piezoelectric material, such as $LiNbO_3$ or $LiTaO_3$, to electrical energy and vice versa is carried out by a transducer which is conventionally composed of a pair of separated, interdigitated comb-shaped electrodes formed on the surface of the piezoelectric material.

One prior art acoustic surface wave device comprises: a piezoelectric substrate having a planer surface for propagation of acoustic surface waves; an input transducer formed on the surface for converting electrical energy into acoustic surface waves; an output transducer formed on the surface and located diagonally with respect to the input transducer, for converting the acoustic surface waves into electrical energy, and; a multistrip coupler (hereinafter referred to as a MSC), including a plurality of parallel and equally spaced conductive elements, formed on the surface and interposed between the input and output transducers so as to be substantially orthogonal to the propagation direction of the acoustic surface waves launched by the input transducer. The MSC serves as an acoustic surface wave path changer only for the acoustic surface waves launched by the input transducer, not for bulk waves which are also launched by the input transducer and travel through the body of the substrate. Thus, the bulk waves which reduce the band-pass performance of the acoustic surface device are prevented from being received into the output transducer. However, this device requires almost twice as much piezoelectric material surface area as a conventional acoustic surface device which has no MSC, and this large surface area results in a higher manufacturing cost.

Another prior art acoustic surface wave device comprises one more input transducer and one more output transducer than the above-mentioned prior art device (see U.S. Pat. No. 3,959,748). In other words, two pairs of transducers, each of which has two connecting pads, are provided. However, only one pair of the transducers which satisfies predetermined conditions, such as time response characteristics and frequency response characteristics, is used. Therefore, in order to select one of the two pairs, testing is carried out which examines whether the transducers satisfy the conditions. First, testing of one pair of transducers is carried out by applying test signals. In this case, four testing probes are placed in contact with the four connecting pads of the pair of transducers. If the first pair of transducers do not satisfy the predetermined conditions, then, testing of the other pair of transducers is carried out in the same way. Once one of the pairs of transducers is selected, the remaining pair of transducers are disabled in order to avoid undesired reflections, which degrade the performance of the device. For example, acoustically absorbent material, such as black wax, is deposited on the remaining pair of tranducers, or dummy impedances are connected across the connecting pads of the remaining pair of transducers. Thus, since either pair of transducers may be usable, the production yield of the acoustic surface devices having two pairs of transducers is improved over that of devices having one pair of transducers located diagonally to each other, which results in a lower mass production cost.

However, in the above-mentioned prior art device having two pairs of transducers, the reliability of testing using a high frequency, such as 30 MHz to 100 MHz, is low because testing can only be carried out by using probing technology which is not suitable for such a high frequency. In addition, during testing, the remaining pair of transducers are not disabled, so that reflections are generated.

SUMMARY OF THE INVENTION

It is a principal object of the present invention to provide a method of manufacturing an acoustic surface wave device having two pairs of transducers in which the reliability of testing is high and undesired reflections during testing are small.

According to the present invention, there is provided a method of manufacturing an acoustic surface wave device in which acoustic surface waves launched by an input transducer into a piezoelectric material are transmitted to an output transducer through a multistrip coupler, comprising the steps of: forming on said piezoelectric material first and second input transducers, and first and second output transducers, each of which is located diagonally with respect to said first and second input transducers, respectively, said multistrip coupler being interposed between said input transducers and said output transducers, and also forming on said piezoelectric material lead patterns between electrodes of said second input and second output transducers; mounting said piezoelectric material on a package base which has first and second pairs of pins therethrough; bonding connecting pads of electrodes of said first input and first output transducers to said first and second pairs of pins, respectively, by wires; testing said device by supplying test signals to said first input transducer and obtaining output signals from said first output transducer, and; when said test indicates said device is usable, fixing a cover to said package base. Thus, the acoustic surface wave device can be tested at an almost completed state without probing technology, which results in a high reliability of testing. In addition, undesired reflections during testing are small.

According to the present invention, there is also provided a method of manufacturing an acoustic surface wave device, in which acoustic surface waves launched by an input transducer into a piezoelectric material are transmitted to an output transducer through a multistrip coupler, comprising the steps of: forming on said piezoelectric material first and second input transducers, and first and second output transducers, each of which is located diagonally with respect to said first and second input transducers, respectively, and said multistrip coupler being interposed between said input transducers and said output transducers, and also forming on said piezoelectric material lead patterns between electrodes of said second input and second output transducers, and external connecting pads connected to electrodes or said first input and first output transducers; mounting said piezoelectric material on a package base which has first and second pairs of pins therethrough; bonding said external connecting pads to said first and second pairs of pins, respectively, by wires; testing said device by supplying test signals to said first input transducer and obtaining output signals from said first output transducer, and; when said test indicates said device is usable, fixing a cover to said package base. This method has a further advantage in that the removing of bonded wires, which is not an easy operation, is not executed.

The present invention will be more clearly understood from the following description with reference to the accompanying drawings.

BRIEF DESCRIPTION OF THE DRAWINGS

FIGS. 10A through 10D are graphs showing the time response characteristics of the devices of FIGS. 4C(4D), 5C(6C), 5D(6D) and 7A(7B, 7C, 8A, 8B, 8C, 9A, 9B, 9C), respectively, and;

FIG. 11 is a graph showing the frequency response characteristics of the devices of the prior art by the broken lines A and B and of the present invention by the solid line C.

DETAILED DESCRIPTION OF THE INVENTION

Figure 1:
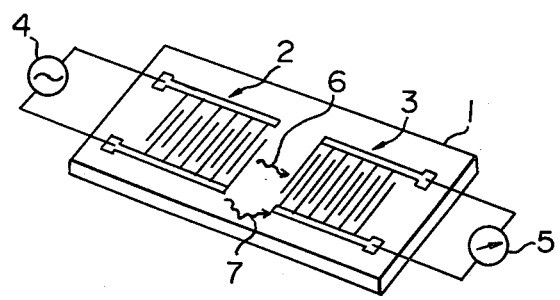
FIG. 1 is a perspective view illustrating a conventional acoustic surface wave device.

Referring to FIG. 1, which illustrates a conventional acoustic surface wave device, an input transducer 2 and an output transducer 3, each of which is composed of two separated, interdigitated comb-shaped electrodes, are formed on the surface of a piezoelectric substrate 1. When an electrical signal from a tracking generator 4 is applied to the two electrodes of the input transducer 2, the electrical signal is converted into acoustic surface waves 6 which are converted into another electrical signal by the output transducer 3. Transducer 3 is in turn which is connected to a load impedance 5. In this case, the frequency of the acoustic surface waves 6 is determined by the spacing of the electrodes of the input transducer 2, which is the same as that of the output transducer 3. Therefore, the device of FIG. 1 serves as a band-pass filter or a delay line. However, in this device, bulk waves 7 are also launched by the input transducer 2 and travel through the body of the substrate 1 to reach the output transducer 3. Accordingly the band-pass characteristics of the device is reduced, since the transit time of the bulk waves 7 is different from that of the acoustic surface waves 6.

In order to prevent the bulk waves from reaching the output transducer 3, an acoustic surface wave device is known wherein an MSC composed of a plurality of parallel and equally spaced conductors between two transducers are located diagonally to each other (see U.S. Pat. No. 3,836,876). The MSC serves as a path changer of the acoustic surface waves, not of the bulk waves. However, this device requires twice as much piezoelectric substrate surface area as the device of FIG. 1.

Figure 2:
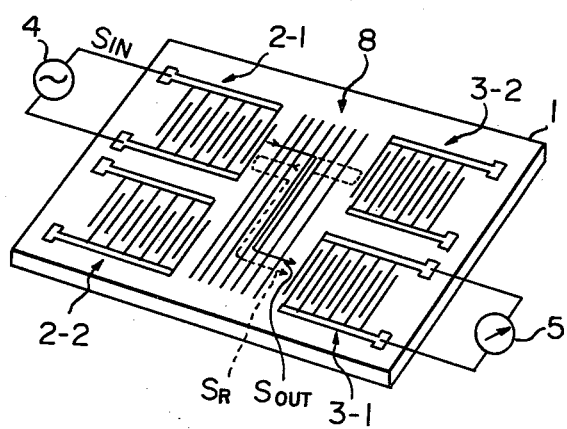
FIG. 2 is a perspective view illustrating another conventional acoustic surface wave device.

FIG. 2 is a perspective view illustrating another conventional acoustic surface device having two pairs of transducers. First, testing of a pair of transducers 2-1 and 3-1 is carried out. If the pair of transducers 2-1 and 3-1 are rejected, testing of the pair of transducers 2-2 and 3-2 is executed. Since either of the two pairs of transducers may be usable, the mass production yield of the device can be improved over that of the device of FIG. 1.

Figure 3A:
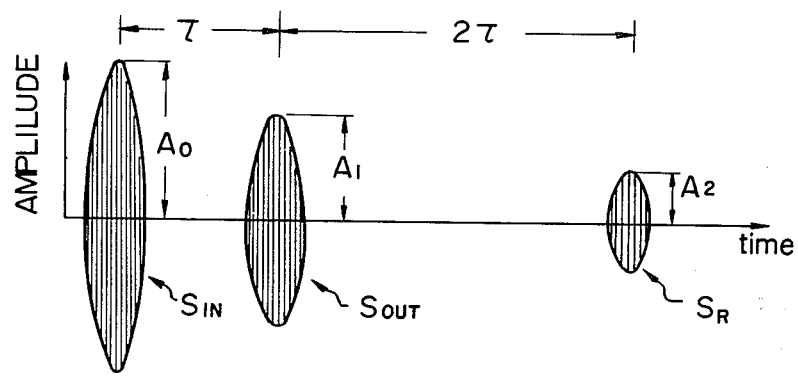
FIG. 3A is a graph showing the time response characteristics of the device of FIG. 2.
Figure 3B:
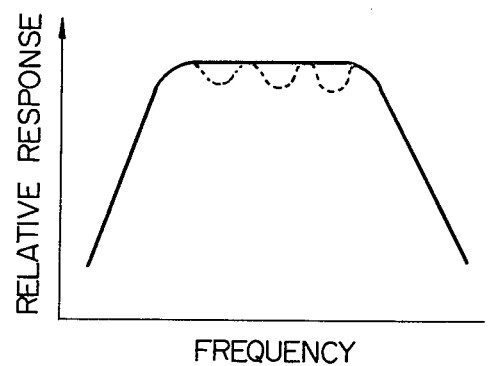
FIG. 3B is a graph showing the frequency response characteristics of the device of FIG. 2.

In FIG. 2, it should be noted that the electrodes of each of the transducers 2-2 and 3-2 are not shorted and, hence, reflections from the transducers 2-2 and 3-2 are large. When an electrical signal $S_{IN}$ from the tracking generator 4 is supplied to the input transducer 2-1, acoustic surface waves are propagated on the surface of the piezoelectric substrate 1. One part of the acoustic surface waves is transmitted via an MSC 8 to the output transducer 3-1, as indicated by $S_{OUT}$, while another part is reflected by the transducer 3-2 to reach the output transducer 3-1, as indicated by $S_R$. As a result, electrical signals $S_{OUT}$ and $S_R$ are obtained in the load impedance 5 as illustrated in FIG. 3A, where $\tau$ is a transit time of the signal $S_{OUT}$ and $3\tau$ is the transit time of the signal $S_R$. Consequently, the frequency response characteristics of the device of FIG. 2 include a large ripple rate, as indicated by a dotted line in FIG. 3B, and the band-pass characteristics of the device of FIG. 2 are reduced. In order to avoid such reduction of the band-pass characteristics, acousitc absorbent materials are used in the non-selected pair of transducers after testing. However, since such acoustic absorbent materials are not used during testing, reflections are large and the reliability of the testing is low. In addition, such testing is carried out by using probing technology which causes the reliability of the testing using high frequencies to become even lower.

In the present invention, an acoustic surface wave device is tested after the device is mounted on a package. Therefore, testing is carried out without using probing technology.

Figure 4A:
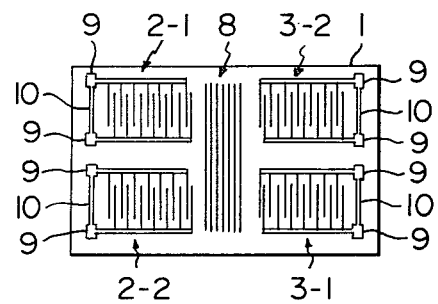
FIGS. 4A through 4D are plan views used for explaining a first embodiment of the method of manufacturing an acoustic surface wave device according to the present invention.

FIGS. 4A through 4D are plan views used of describing a first embodiment of the method of manufacturing an acoustic surface wave device according to the present invention. As indicated in FIG. 4A, two input transducers 2-1 and 2-2, two output transducers 3-1 and 3-2 and an MSC 8 are formed on a piezoelectric substrate 1. Referring to FIG. 4A, connecting pads 9 are formed at the ends of electrodes of the transducers 2-1, 2-2, 3-1 and 3-2, and in addition, lead patterns 10 are formed between the connecting pads 9 of each of the transducers so that all of the transducers are shorted. As a result, an impedance between the electrodes in each of the transducers is nearly equal to a characteristic impedance of an acoustic surface wave path, and, accordingly, reflections from the transducers are small. Here, it should be noted that the input transducer 2-1 operates with the output transducer 3-1, while the input transducer 2-2 operates with the output transducer 3-2.

Figure 4B:
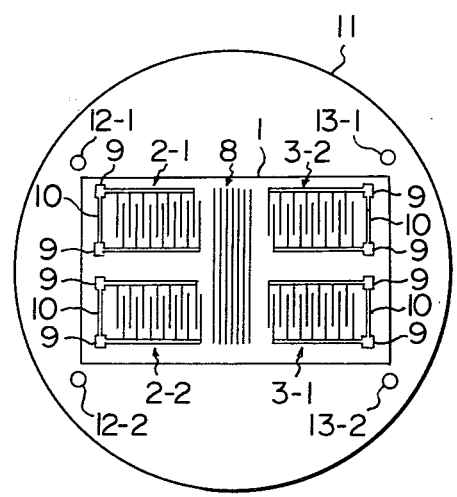

Next, as indicated in FIG. 4B, the piezoelectric substrate 1 is mounted on a package base 11 which has four pins 12-1, 12-2, 13-1 and 13-2.

Figure 4C:
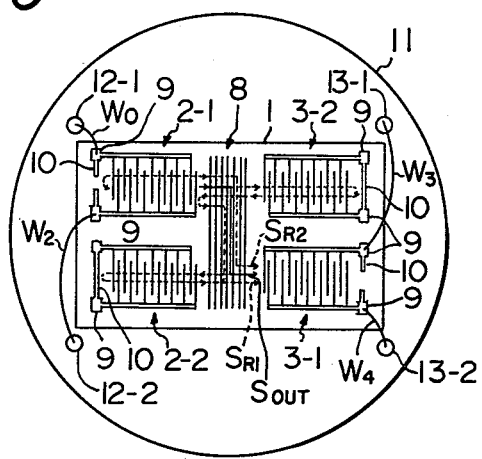

Then, as indicated in FIG. 4C, the lead patterns 10 of the transducers 2-1 and 3-1 are cut. In addition, wires (W) are bonded to the connecting pads 9 of the transducers 2-1 and 3-1 and the pins 12-1, 12-2, 13-1 and 13-2, so that wires $W_1$, $W_2$, $W_3$ and $W_4$ are connected as shown in FIG. 4C. After that, the device of FIG. 4C is mounted on a testing unit (not shown) and, in order to examine the characteristics of the transducers 2-1 and 3-1, testing is carried out. In this case, an electrical test signal is supplied to the transducer 2-1 through the pins 12-1 and 12-2, while an electrical output signal is obtained from the pins 13-1 and 13-2. If the transducers 2-1 and 3-1 are acceptable, a cover (not shown) is fixed to the package base 11. Contrary to this, when the transducers 2-1 and 3-1 are rejected, the following operation is carried out.

Figure 4D:
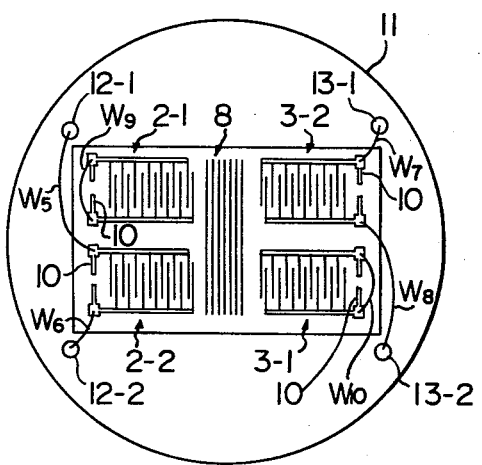

As indicated in FIG. 4D, the lead patterns 10 of the transducers 2-2 and 3-2 are cut. In addition, the wires $W_1$, $W_2$, $W_3$ and $W_4$ are removed, and after that, wires are bonded to the connecting pads 9 of the transducer 2-2 and 3-2, and the pins 12-1, 12-2, 13-1 and 13-2, so that wires $W_5$, $W_6$, $W_7$ and $W_8$ are connected as shown in FIG. 4D. Wires $W_9$ and $W_{10}$ can be connected to the pads 9 of the transducers 2-1 and 3-1, repectively. Then, the device is again mounted on the testing unit (not shown) and testing is carried out in the same way as mentioned above. If the transducer 2-2 and 3-2 are acceptable, a cover (not shown) is fixed to the package base 11. However, if the transducers 2-2 and 3-2 are rejected, the device is also rejected. As can be seen from the above testing is carried out without using probing technology. In this embodiment, it should be noted that the first testing could be carried out for the pair of the transducers 2-2 and 3-2 rather than transducucers 2-1 and 3-1.

Figure 5A:
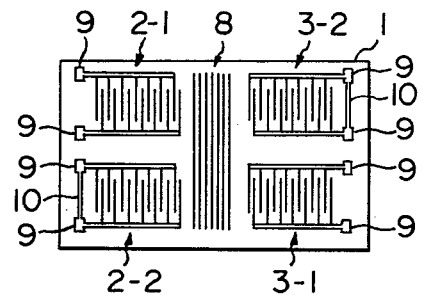
FIGS. 5A through 5D are plan view used for explaining a second embodiment of the method of manufacturing an acoustic surface wave device according to the present invention.
Figure 5B:
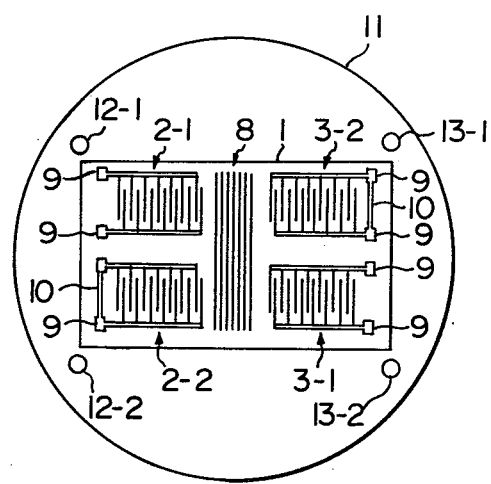

FIG. 5A through 5D are plan views used for explaining a second embodiment of the method of manufacturing an acoustic surface device according to the present invention. The elements in FIGS. 5A through 5D which are identical to those of FIGS. 4A through 4D are denoted by the same reference numerals used in FIGS. 4A through 4D. Referring to FIG. 5A, the transducers 2-1 and 3-1 have no lead patterns. Therefore, first testing must be carried out for the pair of transducers 2-1 and 3-1. As a result, in the manufacturing step indicated in FIG. 5C, the cutting of lead patterns is not carried out in contrast to the operational step carried out in the first embodiment, of the invention.

Figure 5C:
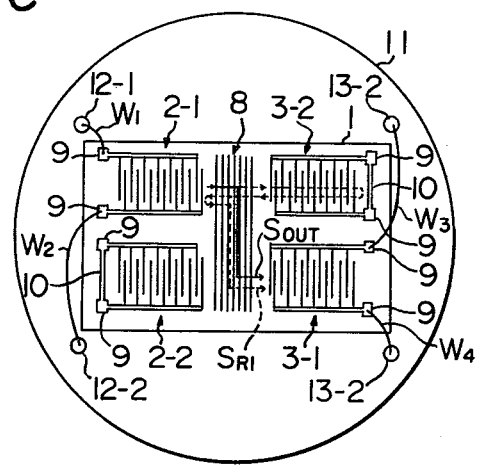
Figure 5D:
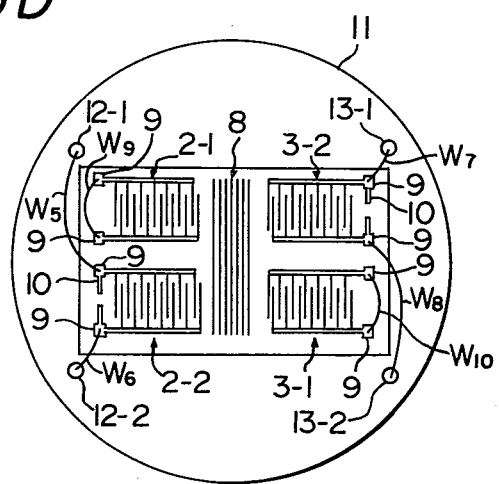
Figure 6A:
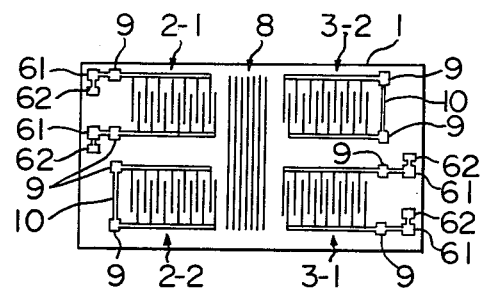
FIGS. 6A through 6D are plan views used for explaining a third embodiment of the method of manufacturing an acoustic surface wave device according to the present invention.
Figure 6B:
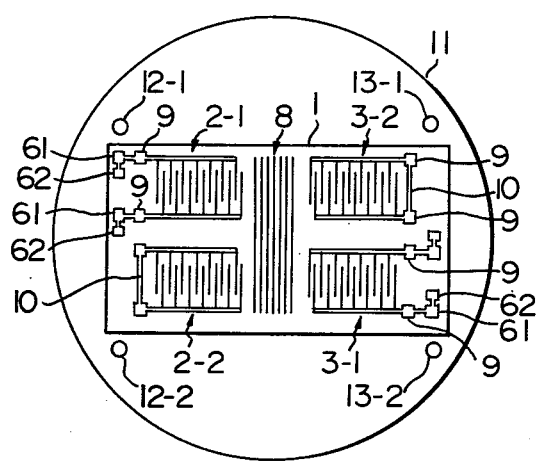
Figure 6C:
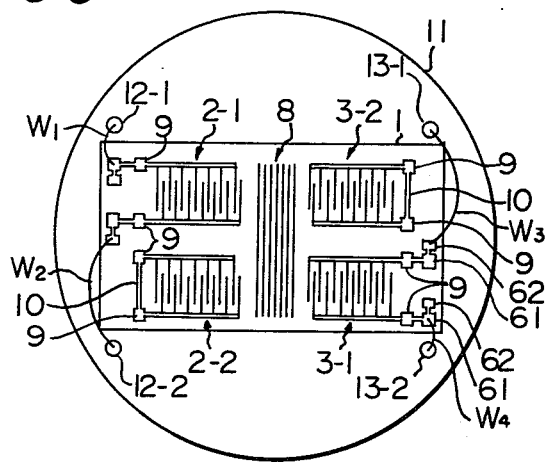
Figure 6D:
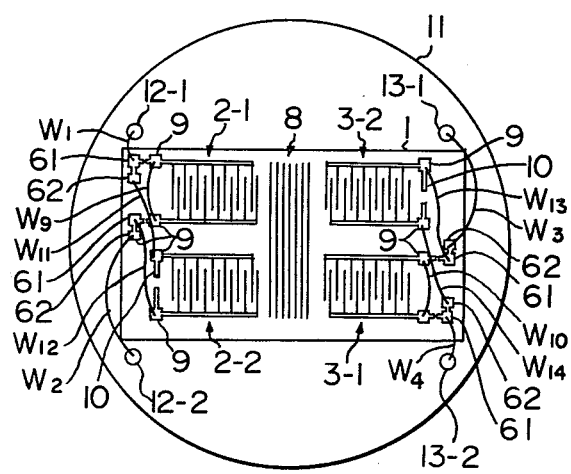

FIGS. 6A through 6D are plan views for explaining a third embodiment of the method of manufacturing an acoustic surface wave device according to the present invention. The elements in FIGS. 6A through 6D which are identical to those of FIGS. 5A through 5D are denoted by the same reference numerals used in FIGS. 5A through 5D. As shown in FIG. 6A, two external connecting pads 61 and 62, which are connected to each other, are connected to the connecting pads 9 of the transducers 2-1 and 3-1. In the manufacturing step as indicated in FIG. 6C, wires $W_1$ and $W_4$, and $W_2$ and $W_3$ are placed in contact with the external connecting pads 61 and 62. After that, first testing for the transducers 2-1 and 3-1 is carried out. If the transducers 2-1 and 3-1 are rejected, second testing for the transducers 2-2 and 3-2 is carried out. In this case, as indicated in FIG. 6D, the lead patterns 10 of the transducers 2-2 and 3-2 are cut. In addition, wires $W_9$ and $W_{10}$ are bonded for shorting the electrodes of the transducers 2-1 and 3-1, and wires $W_{11}$, $W_{12}$, $W_{13}$ and $W_{14}$ are bonded between the connecting pads 9 of the transducers 2-2 and 3-2 and the external connecting pads 61 and 62 so that the transducers 2-2 and 3-2 are connected to the pins 12-1, 12-2, 13-1 and 13-2. After that, the second testing is carried out. Thus, in the manufacturing steps indicated in FIGS. 6A through 6D, the removing of the bonded wires ($W_1$, $W_2$, $W_3$ and $W_4$), *which is not an easy operation, is not carried out.*

In any of the above-mentioned embodiments, testing is carried out without using probing technology, which is not suitable for high frequencies. As a result, the reliability of the testing becomes higher than with the prior art.

In the above-mentioned embodiments, the lead patterns 10 are connected to the connecting pads 9, but the lead patterns 10 can be connected to other portions of the electrodes of the transducers.

In the present invention, the configuration of the lead patterns for electrically shorting the transducers is modified as mentioned below, in order to minimize reflections of acoustic surface waves.

Figure 7A:
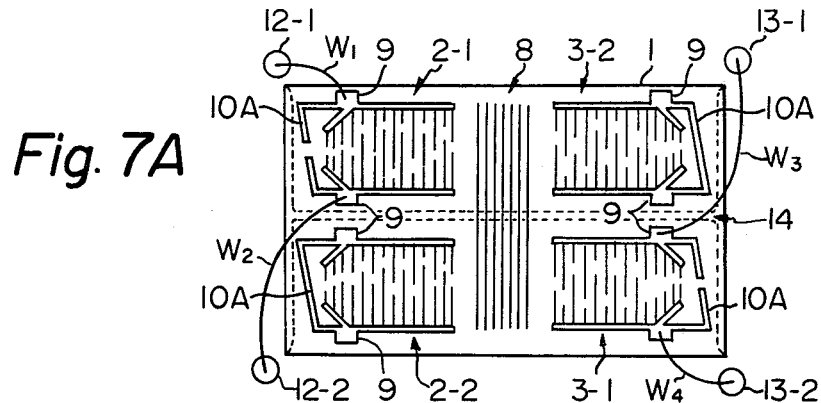
FIGS. 7A, 7B and 7C are modifications of the embodiment illustrated in FIG. 4C.
Figure 7B:
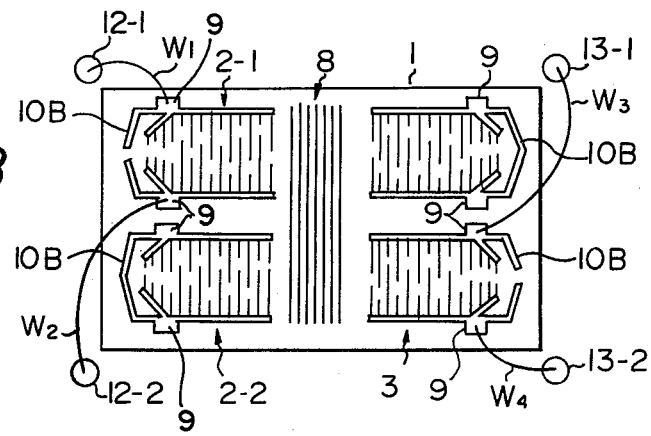
Figure 7C:
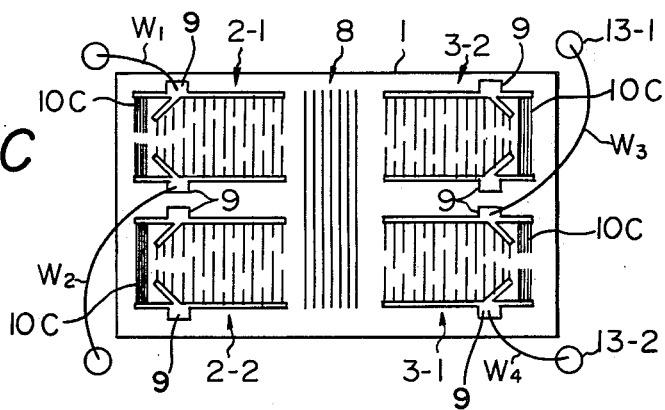
Figure 8A:
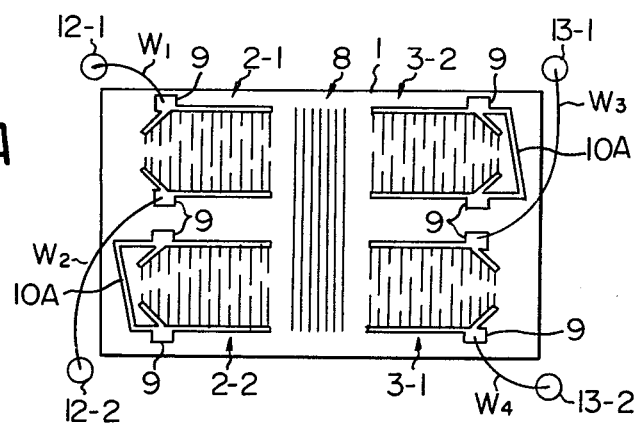
FIGS. 8A, 8B and 8C are modifications of the embodiment illustrated in FIG. 5C.
Figure 8B:
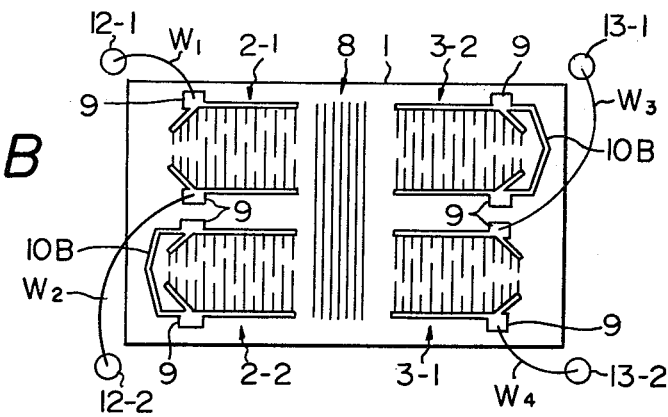
Figure 8C:
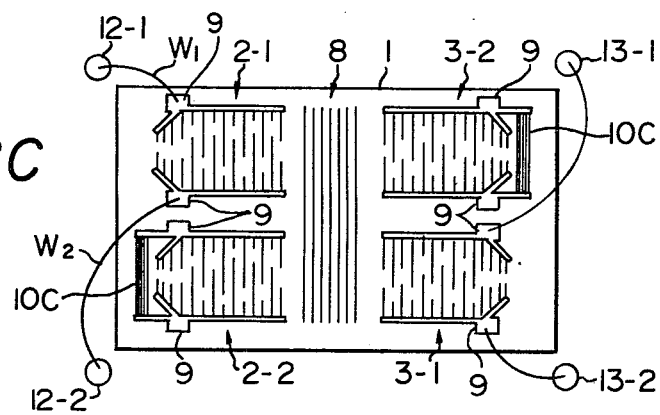
Figure 9A:
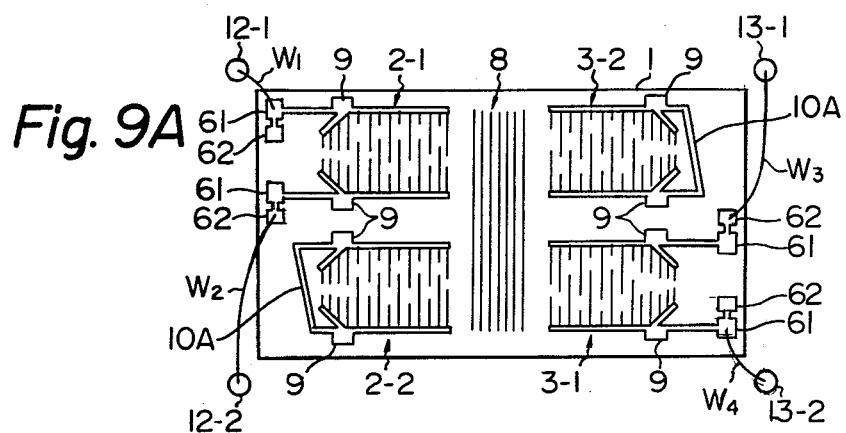
FIGS. 9A, 9B and 9C are modifications of FIG. 6C.
Figure 9B:
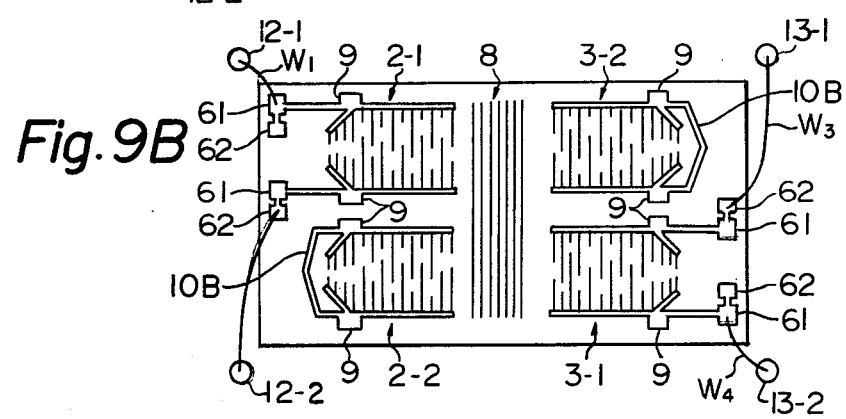
Figure 9C:
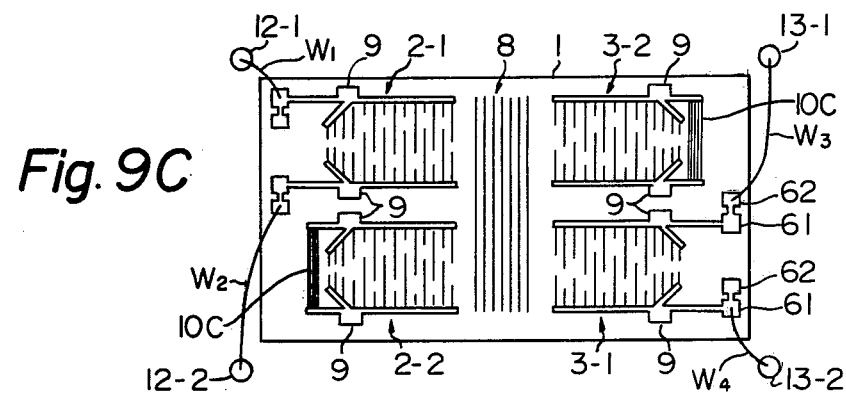

FIGS. 7A through 7C, 8A through 8C and 9A through 9C are modifications of the embodiments illustrated in FIGS. 4C, 5C and 6C, respectively. As shown in these figures, connecting pads 9 are located beside the transducers and, in addition, electrodes which are comb-shaped are modified. In FIGS. 7A, 8A and 9A, each of the lead patterns 10A is composed of a conductor whose inside surface is inclined with regard to the propagation direction of acoustic surface waves so that reflections from the lead patterns 10A are scattered, which means that reflections are substantially small. In FIGS. 7B, 8B and 9B, each of the lead patterns 10B is also composed of a conductor whose inside surface is inclined with regard to the propagation direction, but is bent at the center thereof, so that reflections from the lead patterns 10B are scattered. In FIGS. 7A, 7B, 8A and 8B, the outside surfaces of the lead patterns 10A and 10B are also inclined. However, it should be noted that the outside surface can be orthogonal to the propagation direction. In FIGS. 7C, 8C and 9C, the lead patterns 10C are composed of a plurality of parallel and equally spaced conductors orthogonal to the propagation direction and spaced apart one quarter of an acoustic surface wave wavelength. When the acoustic surface waves penerate into the lead patterns 10C, reflected waves from the conductors interfere with each other so that the reflected waves are neutralized, which means that reflections are substantially small.

In addition, in order to minimize undesired reflections and electromagnetic waves and as illustrated in FIG. 7A, an acoustic absorbent material 14, such as black wax, is coated on the surface of the substrate 1 between the transducers 2-1, 3-2 and the transducers 2-2, 3-1, and on the edges of the substrate 1.

The time response characteristics of the devices of FIGS. 4C, 4D, 5C, 5D, 6C, 6D, 7A through 7C, 8A through 8C through 9A and 9C will now be explained. In the devices shown in these figures, the piezoelectric material 1 is made of $LiNbO_3$ crystal whose surface area is 4 mm $\times$ 13 mm, the cross-width, i.e., the width of the transducers, is 1.5 mm, and the transit time $\tau$ is 2 $\mu$sec. As indicated in FIG. 10A, depicting the case of the device of FIG. 4C (or 4D), when an input signal $S_{IN}$ is supplied to the transducer 2-1, a signal $S_{OUT}$ is received through the MSC 8 by the transducer 3-1. In addition, reflections $S_{R1}$ from the lead pattern 10 of the transducer 3-2 and from the lead pattern 10 of the transducer 2-2 are received by the transducer 3-1. In this case, the amplitude $A_3$ of the reflections $S_{R1}$ is about $-50$ dB ($=20 \log A_3/A_1$). Further, reflections $S_{R2}$ from the cut lead patterns 10 of the transducer 2-1 and from the cut lead pattern 10 of the transducer 3-1 are received by the transducer 3-1. In this case, the amplitude $A_4$ of the reflections $S_{R2}$ is about $-45$ dB. Furthermore, a signal $S_T$ which is called a triple transit echo is received by the transducer 3-1. The amplitude $A_2'$ of the signal $S_T$ is about $-43$ dB. Any one of the amplitudes $A_2'$, $A_3$ or $A_4$ is smaller than the amplitude $A_2$ of the signal $S_R$ (FIGS. 2, 3A and 3B) which is about $-40$ dB.

As indicated in FIG. 10B, in the case of the device of FIG. 5C (or 6C), reflections $S_{R2}$ are not present, since the transducers 2-1 and 3-1 have no lead patterns 10. Similarly, as indicated in FIG. 10C, in the case of the device in FIG. 5D (or 6D), reflection $S_{R1}$ are not present, since the transducers 2-1 and 3-1 have no lead patterns 10. On the other hand, as indicated in FIG. 10D, in the case of the devices of FIG. 7A (or 7B, 7C, 8A, 8B, 8C, 9A, 9B or 9C), reflections are substantially eliminated by the lead patterns 10A, 10B and 10C.

The amplitudes of undesired signals, such as $S_{R1}$, $S_{R2}$, $S_T$ appearing in the devices of the present invention, are smaller than the amplitude $A_2$ of the signal $S_R$ appearing in the device of FIG. 3A or the prior art. In FIG. 11, the frequency response characteristics, which include a large ripple, for the prior art device of FIG. 2, are illustrated by a dot-dash line A or a dotted line B, while the frequency response characteristics, which include a small ripple, for the device according to the present invention are illustrated by a solid line C.

As explained hereinbefore, the method for manufacturing an acoustic surface wave device according to the present invention has the following advantages, as compared with those of the prior art.

(1) The reliability of testing is high, since testing is carried out without using probing technology.

(2) Undesired reflections during testing are small, since the non-tested transducers are electrically shorted by wires or lead patterns.

We claim:

1. A method of manufacturing an acoustic surface wave device, in which acoustic surface waves launched by an input transducer into a piezoelectric material are transmitted to an output transducer through a multistrip coupler, comprising the steps of:
    forming on said piezoelectric material first and second input transducers, first and second output transducers diagonally with respect to said first and second input transducers, respectively, said multistrip coupler between said input transducers and said output transducers, and lead patterns between electrodes of each of said second input and second output transducers;
    mounting said piezoelectric material on a package base which has first and second pairs of pins therethrough;
    bonding the electrodes of said first input and first output transducers to said first and second pairs of pins, respectively, by wires;
    testing said device by supplying test signals to said first input transducer and obtaining output signals from said first output transducer through said first and second pairs of pins, respectively; and,
    when said testing step indicates said device is usable, fixing a cover to said package base.

2. A method as set forth in claim 1, wherein said forming step further includes forming lead patterns between the electrodes of each of said first input and first output transducers and wherein said bonding step further includes the step of cutting the lead patterns of said first input and first output transducers.

3. A method as set forth in claim 1 or 2, comprising after the testing step the further steps of:
    cutting the lead patterns between the electrodes of said second input and second output transducers, removing the wires connecting the electrodes of said first input and first output transducers to said first and second pairs of pins, respectively, and bonding the electrodes of said second input and second output transducers of said first and second pairs of pins, respectively, by wires;
    testing said device by supplying said test signals to said second input transducer and obtaining said output signals from said second output transducer through said first and second pairs of pins, respectively; and,
    when said testing step indicates said device is usable, fixing said cover to said package base.

4. The method of claim 3, wherein the electrodes of each of said transducers are formed with a connecting pad for bonding with said wires.

5. A method of manufacturing an acoustic surface wave device, in which acoustic surface waves launched by an input transducer into a piezoelectric material are transmitted to an output transducer through a multistrip coupler, comprising the steps of:
    forming on said piezoelectric material first and second input transducers, first and second output transducers diagonally with respect to said first and second input transducers, respectively, said multistrip coupler between said input transducers and said output transducers, lead patterns between electrodes of each of said second input and second output transducers, and external connecting pads connected to electrodes of said first input and first output transducers;
    mounting said piezoelectric material on a package base which has first and second pairs of pins therethrough;
    bonding said external connecting pads to said first and second pairs of pins, respectively, by wires;
    testing said device by supplying test signals to said first input transducer and obtaining output signals from said first output transducer through said first and second pairs of pins, respectively; and,
    when said testing step indicates said device is usable, fixing a cover to said package base.

6. A method as set forth in claim 5, comprising after the testing step the further steps of:
    cutting said lead patterns between the electrodes of said second input and second output transducers and bonding the electrodes of each of said first input and first output transducers by wires, and connecting said external connecting pads to electrodes of said second input and second output transducers, respectively, by wires;
    testing said device by supplying said test signals to said second input transducer and obtaining said output signals from said second output transducer through said first and second pairs of pins, respectively; and, when said testing step indicates said device is usable, fixing said cover to said package base.

7. A method as set forth in claim 1 or 5, wherein each of said lead patterns is composed of a conductor having an inside surface orthogonal to the propagation direction of acoustic surface waves.

8. A method as set forth in claim 1 or 5, wherein each of said lead patterns is composed of a conductor having an inclined reflected surface with regard to the propagation direction of acoustic surface waves.

9. A method as set forth in claim 1 or 5, wherein each of said lead patterns is composed of a plurality of parallel and equally spaced conductors orthogonal to the propagation direction of acoustic surface waves and spaced apart one quarter of an acoustic surface wave wavelength.

10. A method as set forth in claim 1 or 5, further comprising the step of coating acoustic absorbent materials on the surface of said piezoelectric material between said transducers orthogonal to said multistrip coupler and on the edges of said piezoelectric material.

11. A method of manufacturing an acoustic surface wave device, in which acoustic surface waves launched by an input transducer into a piezoelectric material are transmitted to an output transducer through a multistrip coupler, comprising the steps of:
(a) forming on the piezoelectric material two pairs of input and output transducers, a multistrip coupler between the input and output transducers, and lead patterns for electrically shorting at least one pair of the input and output transducers;
(b) mounting the piezoelectric material on a package base having two pairs of pins;
(c) bonding electrodes of the non-shorted pair of input and output transducers to respective pairs of pins by wires; and,
(d) testing the device by supplying signals to the non-shorted input transducer and obtaining signals from the non-shorted output transducer through the respectively connected pairs of pins.

12. The method of claim 11 comprising the further steps, when the testing step indicates said device is not usable, of:
cutting the lead patterns of the first pair of shorted input and output transducers for non-shorting;
removing the wires connecting the electrodes of the first non-shorted transducers to the respective pair of pins and bonding the electrodes of said first non-shorted transducers by wires for electrical shorting;
bonding the electrodes of the non-shorted pair of input and output transducers to respective pairs of pins by wires; and,
testing the device by supplying signals to the non-shorted input transducer and obtaining signals from the non-shorted output transducer through said respectively connected pair of pins.

13. A method of manufacturing an acoustic surface wave device, in which acoustic surface waves launched by an input transducer into a piezoelectric material are transmitted to an output transducer through a multistrip coupler, comprising the steps of:
(a) forming on the piezoelectric material two pairs of input and output transducers, a multistrip coupler between the input and output transducers, lead patterns for electrically shorting one pair of the input and output transducers, and external connecting paths connected to electrodes of the non-shorted pair of input and output transducers;
(b) mounting the piezoelectric material on a package base having two pairs of pins;
(c) bonding the external connecting pads of the non-shorted pair of input and output transducers to respective pairs of pins by wires; and
(d) testing the device by supplying signals to the non-shorted input transducer and obtaining signals from the non-shorted output transducer through the respectively connected pairs of pins.

14. The method of claim 13 comprising the further steps, when testing step indicates said device is not usable, of:
cutting the lead patterns of the first pair of shorted input and output transducers for non-shorting;
bonding the electrodes of the first non-shorted transducers by wires for electrical shorting;
bonding the external connecting pads to the electrodes of the non-shorted pair of input and output transducers by wires; and,
testing the device by supplying signals to the non-shorted input transducer and obtaining signals from the non-shorted output transducer through said respectively connected pairs of pins and external connecting pads.

15. The method of claim 11 or 13 comprising the further step of fixing a cover to said package base when the testing step indicates said device is usable.

16. The method of claim 1, 5, 6, 11, 12, 13 or 14, wherein the electrodes of each of said transducers are formed with a connecting pad for bonding with said wires.

17. The method of claim 16 wherein the lead patterns are formed between the connecting pads of the electrodes of the respective transducers.

* * * * *

UNITED STATES PATENT AND TRADEMARK OFFICE
CERTIFICATE OF CORRECTION

PATENT NO. : 4,314,393

DATED : February 9, 1982

INVENTOR(S) : Noboru Wakatsuki et al.

It is certified that error appears in the above—identified patent and that said Letters Patent is hereby corrected as shown below:

Column 2, line 61, "or" should be --of--.
Column 3, line 23, "view" should be --views--;
Column 3, line 35, after "of" insert --the embodiment illustrated in--;
Column 3, line 57, delete "which is".
Column 4, line 51, "of" should be --for--.
Column 5, line 17, "when" should be --if--;
Column 5, line 23, "transducer" should be --transducers--;
Column 5, line 30, "transducer" should be --transducers--;
Column 5, line 34, after "above" insert --,--;
Column 5, line 37, "transducucers" should be --transducers--;
Column 5, line 51, delete ",".
Column 6, line 10, "$W_4)$," should be --$W_4)$,--; "which is not an easy" should be in regular typeset on the line [not in italics below the line];
Column 6, line 11, "operation, is not carried out." should be in regular typeset [not in italics];
Column 6, line 61, "through 9A and" should be --and 9A through--.
Column 8, line 17, "of" should be --to--.

Signed and Sealed this

Sixth Day of July 1982

[SEAL]

Attest:

GERALD J. MOSSINGHOFF

*Attesting Officer*  *Commissioner of Patents and Trademarks*

UNITED STATES PATENT AND TRADEMARK OFFICE
CERTIFICATE OF CORRECTION

PATENT NO. : 4,314,393
DATED : February 9, 1982
INVENTOR(S) : Noboru Wakatsuki et al.

It is certified that error appears in the above-identified patent and that said Letters Patent is hereby corrected as shown below:

On title page, Item [75] Inventors: change "Ono Masaaki" to --Masaaki Ono--.

Signed and Sealed this

Twenty-second Day of February 1983

[SEAL]

Attest:

GERALD J. MOSSINGHOFF

*Attesting Officer*  *Commissioner of Patents and Trademarks*